US011869989B2

(12) United States Patent
Mizuno et al.

(10) Patent No.: US 11,869,989 B2
(45) Date of Patent: Jan. 9, 2024

(54) ELECTRODE STRUCTURE AND PHOTODETECTION ELEMENT

(71) Applicant: TDK CORPORATION, Tokyo (JP)

(72) Inventors: Tomohito Mizuno, Tokyo (JP);
Takekazu Yamane, Tokyo (JP);
Hideaki Fukuzawa, Tokyo (JP);
Tetsuya Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/509,730

(22) Filed: Oct. 25, 2021

(65) Prior Publication Data

US 2022/0131020 A1 Apr. 28, 2022

(30) Foreign Application Priority Data

Oct. 27, 2020 (JP) ................................ 2020-179347
Aug. 4, 2021 (JP) ................................ 2021-128503

(51) Int. Cl.
*H01L 31/0224* (2006.01)
*H01L 27/146* (2006.01)
*H04B 10/114* (2013.01)
*H04B 10/69* (2013.01)
*H04B 10/50* (2013.01)

(52) U.S. Cl.
CPC .............. *H01L 31/022466* (2013.01); *H01L 27/14643* (2013.01); *H04B 10/1143* (2013.01); *H04B 10/501* (2013.01); *H04B 10/691* (2013.01)

(58) Field of Classification Search
CPC ...... H01L 31/022466; H01L 27/14643; H04B 10/1143; H04B 10/501; H04B 10/691
See application file for complete search history.

(56) References Cited

U.S. PATENT DOCUMENTS

| 6,925,261 | B2 | 8/2005 | Haruyama | |
| 2001/0040713 | A1 | 11/2001 | Haruyama | |
| 2018/0129798 | A1* | 5/2018 | He | G06V 40/1306 |
| 2019/0303639 | A1* | 10/2019 | He | G09G 3/3208 |

FOREIGN PATENT DOCUMENTS

| JP | 2001-292107 A | | 10/2001 | |
| JP | 2011135058 A | * | 7/2011 | ............. B82Y 20/00 |
| WO | WO-2005098966 A1 | * | 10/2005 | ..... H01L 31/022408 |

OTHER PUBLICATIONS

Chen et al.; "All-Optical Switching of Magnetic Tunnel Junctions with Single Subpicosecond Laser Pulses;" Physical Review Applied; 2017; pp. 021001-1-021001-6; vol. 7, No. 021001.

* cited by examiner

*Primary Examiner* — Matthew E Warren
(74) *Attorney, Agent, or Firm* — Oliff PLC

(57) ABSTRACT

An electrode structure includes: a metal film with an opening formed in a part of the metal film; and a transparent conductive film disposed in the opening, wherein the transparent conductive film is electronically connected to an element and overlaps with the element as viewed in a plan view in a thickness direction of the transparent conductive film.

18 Claims, 5 Drawing Sheets

ELECTRODE STRUCTURE AND PHOTODETECTION ELEMENT

BACKGROUND

The present disclosure relates to an electrode structure and a photodetection element.

Priority is claimed on Japanese Patent Application No. 2020-179347, filed on Oct. 27, 2020, and Japanese Patent Application No. 2021-128503, filed on Aug. 4, 2021, the contents of which are incorporated herein by reference.

With the spread of the Internet, an amount of communication has increased dramatically and the importance of optical communication is significantly increasing. Optical communication is a communication means configured to convert an electrical signal into an optical signal and perform transmission and reception using the optical signal.

For example, Patent Document 1 describes a receiving device configured to receive an optical signal using a photodiode. The photodiode is, for example, a pn junction diode using a pn junction of a semiconductor or the like.

PATENT DOCUMENTS

[Patent Document 1] Japanese Unexamined Patent Application, First

SUMMARY

With the development of information and communication technology, further increase of communication speed is required. Examples of high-speed communication include optical communication with far-infrared light used in a long-distance network and optical communication with visible light used between terminals. However, when visible light is used for high-speed optical communication, there is a problem that the reception sensitivity of the Si semiconductor photodiode is remarkably lowered when the frequency becomes several tens of GHz or more. On the other hand, the inventor has found that if a magnetic element having a spacer layer between two ferromagnetic layers is used, it can respond to a high-frequency optical signal and can be used as a receiving element for a high-frequency optical signal. In order to use such a magnetic element as an optical signal receiving element, a new structure capable of efficiently transmitting an optical signal to the element and efficiently extracting an electric signal from the element is required.

It is desirable to provide an electrode structure capable of efficiently transmitting an optical signal to the element and efficiently extracting an electric signal from the element, and an optical detection element having the electrode structure.

The following means is provided.

(1): According to the first aspect, there is provided an electrode structure including: a metal film with an opening formed in a part of the metal film; and a transparent conductive film disposed in the opening, wherein the transparent conductive film is electronically connected to an element and overlaps with the element as viewed in a plan view in a thickness direction of the transparent conductive film.

(2): In the electrode structure according the above-described aspect, the opening may be formed so that the element is positioned within the opening as viewed in the plan view in the thickness direction.

(3): In the electrode structure according the above-described aspect, a length of the opening may less than a wavelength of a light to be applied to the transparent conductive film.

(4): According to the second aspect, there is provided a photodetection element including; a first electrode and a second electrode; and at least one magnetic element disposed between the first electrode and the second electrode, the at least one magnetic element including a first ferromagnetic layer, a second ferromagnetic layer and a spacer layer sandwiched between the first ferromagnetic layer and the second ferromagnetic layer, wherein the first electrode includes a metal film with an opening formed in a part of the metal film, and a transparent conductive film disposed in the opening, the transparent conductive film is electronically connected to the magnetic element and overlaps with the magnetic element as viewed in the plan view in the thickness direction of the transparent conductive film, and the transparent conductive film is configured to be irradiated with light.

(5): In the photodetection element according the above-described aspect, the opening may be formed so that the magnetic element is positioned within the opening as viewed in the plan view in the thickness direction.

(6): According to the above-described aspect, a length of the opening may be less than a wavelength of a light to be applied to the transparent conductive film.

(7): According to the above-described aspect, the photodetection element may further includes a light transmitter, the light transmitter includes, a first diffraction grating portion disposed on one end of the light transmitter and configured to be irradiated with light from an outside, a second diffraction grating portion disposed on other end of the light transmitter and configured to output light transmitted from the first diffraction grating portion; and a waveguide disposed between the first diffraction grating portion and the second diffraction grating portion, and an area of the first diffraction grating portion is more than an area of the second diffraction grating portion as views in a plan view of the light transmitter.

(8): According to the above-described aspect, the at least one magnetic element may include a plurality of magnetic elements arranged, and the opening may be formed so that the plurality of magnetic elements are positioned within the opening as viewed in the plan view in the thickness direction of the transparent conductive film.

According to the present disclosure, it is possible to provide an electrode structure and an optical detection element that can efficiently take out an electric signal from the element while efficiently transmitting an optical signal to the element.

DETAILED DESCRIPTION

Figure 1:
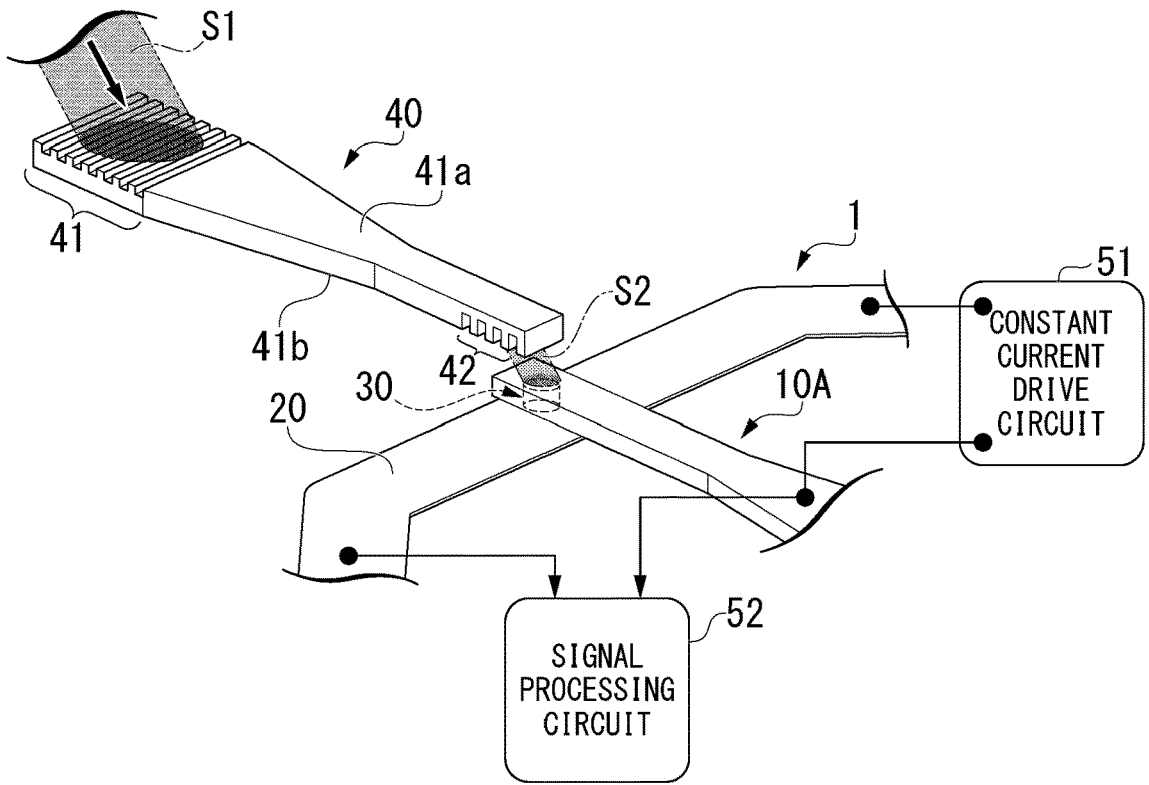
FIG. 1 is a perspective view schematically showing a configuration of an optical detection element according to an embodiment of the present disclosure.

Hereinafter, the present disclosure will be described in detail with reference to the drawings as appropriate. In the drawings used in the following description, featured parts may be enlarged parts for convenience so that the features of the present disclosure are easier to understand, and dimensional ratios and the like of the respective components may be different from actual ones. Materials, dimensions, and the like exemplified in the following description are examples, the present disclosure is not limited thereto, and modifications can be appropriately made in a range in which advantageous effects of the present disclosure are exhibited.

Directions will be defined. The lamination direction of a photodetection element 1 (the lamination direction of the magnetic element 30) is defined as a z direction, one direction within a plane orthogonal to the z direction is an x direction, and a direction orthogonal to the x direction and the z direction is defined as a y direction. The z direction is an example of the lamination direction. Hereinafter, a +z direction may be expressed as an "upward" direction and a −z direction may be expressed as a "downward" direction. Hereinafter, the +z direction is a direction from the first electrode to the second electrode, both of which will be described later. The upward and downward directions do not always coincide with a direction in which gravity is applied.

FIG. 1 is a perspective view schematically showing a configuration of a photodetection element according to an embodiment of the present disclosure.

As shown in FIG. 1, the light detection element 1 includes the first electrode 10A and the second electrode 20, and the magnetic element 30 disposed between the first electrode and the second electrode. The magnetic element 30 will be described later. The photodetection element 1 further includes a light transmitter 40 that irradiates a transparent conductive film described later provided in the first electrode 10A with light. The first electrode 10A and the second electrode 20 are electrically connected to the constant current drive circuit 51 and the signal processing circuit 52, respectively.

Note that the light in the present disclosure is used to include not only visible light but also infrared light having a wavelength longer than that of visible light and ultraviolet light having a wavelength shorter than that of visible light.

Figure 2:
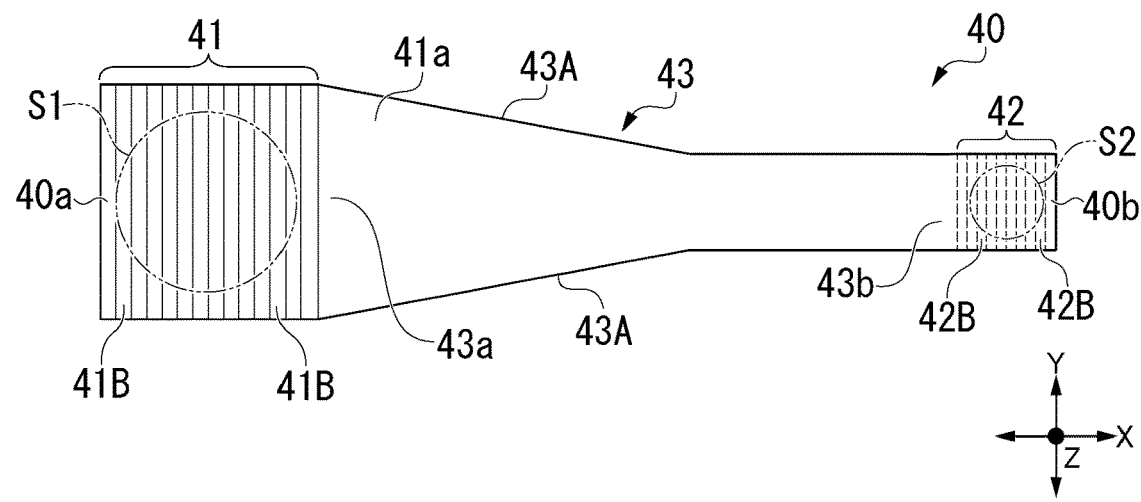
FIG. 2 is a plan view showing the configuration of the light transmitter in HG. 1.

FIG. 2 is a plan view showing the configuration of the light transmitter 40 in FIG. 1. As shown in FIG. 2, the light transmitter 40 includes: the first diffraction grating portion 41 disposed on one end 40a of the light transmitter 40 and configured to be irradiated with light from the outside; the second diffraction grating portion 42 disposed on other end 40b of the light transmitter 40 and configured to output light transmitted from the first diffraction grating portion 41; and the waveguide 43 disposed between the first diffraction grating portion 41 and the second diffraction grating portion 42. The shape of the light transmitter 40 is not particularly limited, but is formed of, for example, a long plate-shaped body. The light transmitter 40 has a core through which light propagates and a clad arranged on the outside so as to cover the core. The core is composed of, for example, tantalum oxide ($Ta_2O_5$). The clad is made of, for example, silicon oxide ($SiO_x$, x=1 to 2) or aluminum oxide ($Ai_2O_3$).

The first diffraction grating portion 41 is provided on one main surface 41a of the light transmitter 40, and has multiple grooves 41B extending in the y direction of the light transmitter 40. In the present embodiment, the x direction is the longitudinal direction of the light transmitter 40, the y direction is the width direction (lateral direction) of the light transmitter 40, and multiple grooves 41B extend along the width direction of the light transmitter 40.

The second diffraction grating portion 42 is provided on the other main surface 41b of the light transmitter 40, and has multiple grooves 42B extending in the y direction of the light transmitter 40. In this embodiment, multiple grooves 42B extend along the width direction of the light transmitter 40.

In the plan view of the light transmitter 40, the area of the first diffraction grating portion 41 may be more than the area of the second diffraction grating portion 42. Shapes of the first diffraction grating portion 41 and the second diffraction grating portion 42 in a plan view is not particularly limited. However, each of them may be, a substantially rectangular shape, for example. The dimensions and cross-sectional shape of the groove 41B constituting the first diffraction grating portion 41 may be the same as the dimensions and cross-sectional shape of the groove 42B constituting the second diffraction grating portion 42. Alternatively, these shapes may be different.

The waveguide 43 transmits the light incident on the first diffraction grating section 41 to the second diffraction grating section 42. In the present embodiment, the waveguide 43 has a tapered shape, and the y-direction dimension (width direction dimension) of the waveguide 43 gradually decreases from the first diffraction grating portion 41 toward the second diffraction grating portion 42. By making the cross-sectional area of the waveguide 43 along the y direction smaller from the first diffraction grating portion 41 toward the second diffraction grating portion 42, the spot diameter of the light S2 emitted from the second diffraction grating portion 42 becomes smaller than the spot diameter of the light S1 incident on the first diffraction grating portion 41. The spot diameter of the light S1 is, for example, 1 μm or more and 2 μm or less. The spot diameter of the optical signal S2 is about the wavelength of the optical signal. For example, when the first diffraction grating portion 41 is irradiated with light (lights) having a wavelength of 500 nm with a spot diameter of 1 μm or more and 2 μm or less, the light (lights) having a spot diameter of, for example, 500 nm is emitted from the second diffraction grating portion by the waveguide 43. By receiving the light S1 having a relatively large spot diameter on the order of several microns with the first diffraction grating portion 41 and transmitting the light through the waveguide 43, the light S2 having a spot diameter as small as the wavelength of light can be emitted from the second diffraction grating portion 42

In the present embodiment, the widthwise end surface 43A of the waveguide 43 has a linear shape in a plan view. However, the present disclosure is not limited to the description. It is acceptable as long as the widthwise dimension of the end portion 43b on the second diffraction grating portion 42 side has a shape smaller than the widthwise dimension of the waveguide 43 in the end portion 43a on the first diffraction grating portion 41 side.

For example, the widthwise end surface 43A of the waveguide 43 may have a curved shape or a stepped shape in a plan view.

Further, the waveguide 43 may have the first part, in which the cross-sectional area along the y direction decreases from the first diffraction grating portion 41 toward the second diffraction grating portion 42, and the second part, in which the cross-sectional area long the y direction is substantially the same as that of the first part.

Figure 3A:
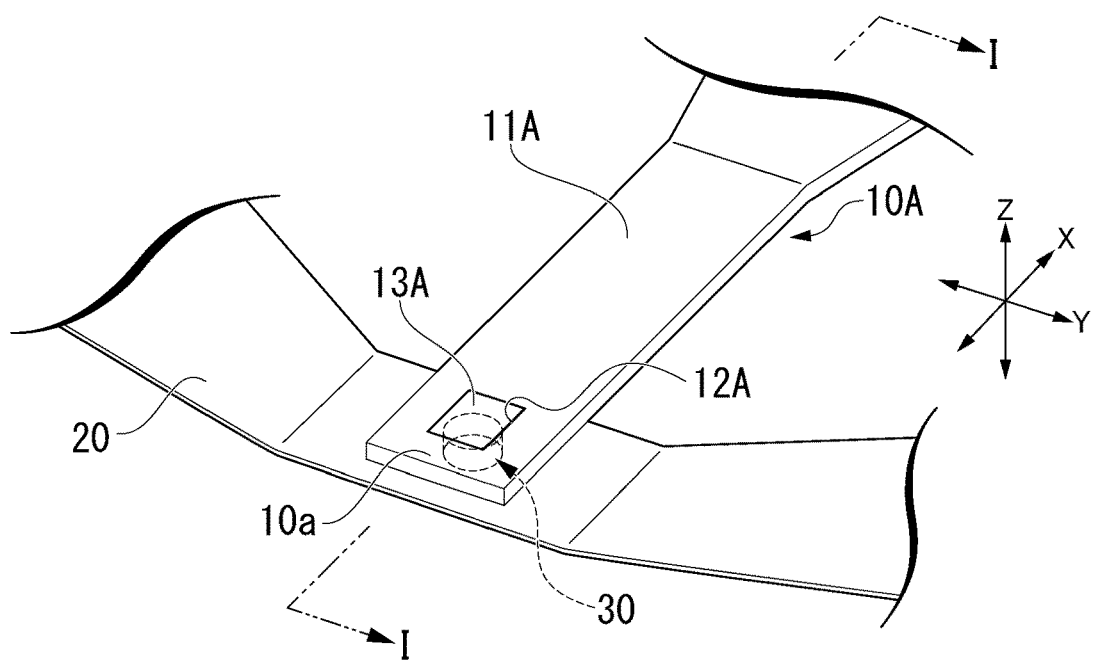
FIG. 3A is an enlarged perspective view of the photodetection element of FIG. 1.
Figure 3B:
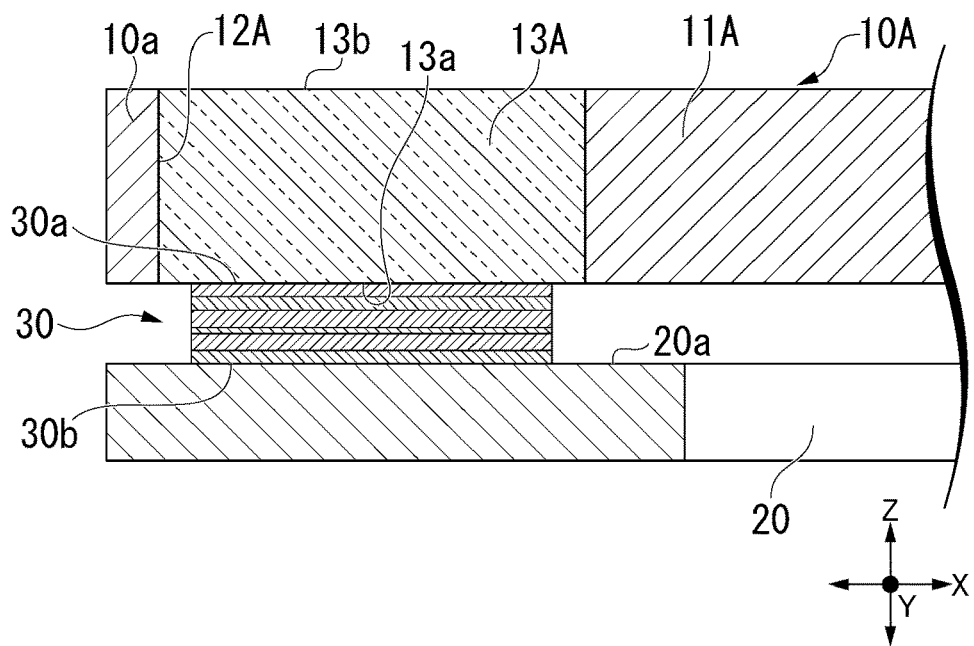
FIG. 3B is a cross-sectional view along the line I-I in FIG. 3A.

FIG. 3A is an enlarged perspective view of the photodetection element 1 of FIG. 1, and FIG. 3B is a cross-sectional view along the line 1-1 of FIG. 3A.

As shown in FIGS. 3A and 3B, the first electrode 10A includes the metal film 11A, the opening 12A provided in a part of the metal film 11A, and the transparent conductive film 13A arranged in the opening 12A. The transparent conductive film 13A is electrically connected to the magnetic element 30 (element) and is arranged so as to overlap the magnetic element 30 in a plan view from the thickness direction (z direction) of the transparent conductive film 13A. The transparent conductive film 13A has main surfaces 13a and 13b facing each other in the thickness direction. In the examples shown in FIGS. 3A and 3B, a part of one main surface 13a of the transparent conductive film 13A is in contact with at least a part of the end surface 30a in the z direction (stacking direction) of the magnetic element 30. When the other main surface 13b of the transparent conductive film 13A is irradiated with light, the light transmitted through the transparent conductive film 13A is applied to the magnetic element 30. The first electrode 10A may have a thin film having electrical conductivity and transmitting light between the transparent conductive film 13A and the magnetic element 30.

The shape of the first electrode 10A is not particularly limited. However, it may be, for example, a long plate-like body extending in the x direction. The thickness (dimension in the z direction) of the metal film 11A is, for example, 50 nm or more and 100 nm or less. The metal film 11A is made of a metal such as copper, silver, gold, or the like.

The opening 12A is formed at the end portion 10a in the longitudinal direction of the first electrode 10A, and has a substantially rectangular shape in a plan view from, for example, the z direction. The opening 12A is formed so as to penetrate the metal film along the z direction.

The transparent conductive film 13A is provided substantially parallel to the metal film 11A so as to close the entire opening 12A. In the present embodiment, the transparent conductive film 13A has a substantially rectangular shape in a plan view like the opening 12A. The thickness of the transparent conductive film 13A may be the same as or smaller than the thickness of the metal film, for example, 25 nm to 100 nm.

The transparent conductive film 13A has transparency to light in the wavelength range used by the light S1. The wavelength range of the light used for the light S1 is, for example, 300 nm or more and 2000 nm or less, and includes a visible light range. The transparent conductive film 13A is made of a non-metal substance, for example, an oxide. The transparent conductive film 13A is composed of one or more selected from, for example, indium tin oxide (ITO), zinc oxide (IZO), zinc oxide (ZnO), and zinc indium gallium oxide (IGZO). The electrical resistivity of the transparent conductive film 13A is more than the electrical resistivity of the metal film. However, since the transparent conductive film 13A is arranged in the opening 12A provided in a part of the metal film, the resistance of the first electrode 10A can be reduced as compared with the case where the entire body is made of a transparent conductive film. Therefore, according to the electrode structure of the first electrode 10A, the electric signal from the magnetic element 30 can be efficiently taken out while efficiently transmitting the light S1 to the magnetic element 30.

The shape of the second electrode 20 is not particularly limited. However, it may be, for example, a long plate-like body extending in the y direction. The thickness (dimension in the z direction) of the second electrode 20 is, for example, 20 nm to 80 nm. The second electrode 20 may be constituted of, for example, a laminated film of Ta, Cu and Ta, a laminated film of Ta, Cu and Ti, and a laminated film of Ta, Cu and TaN.

Figure 4:
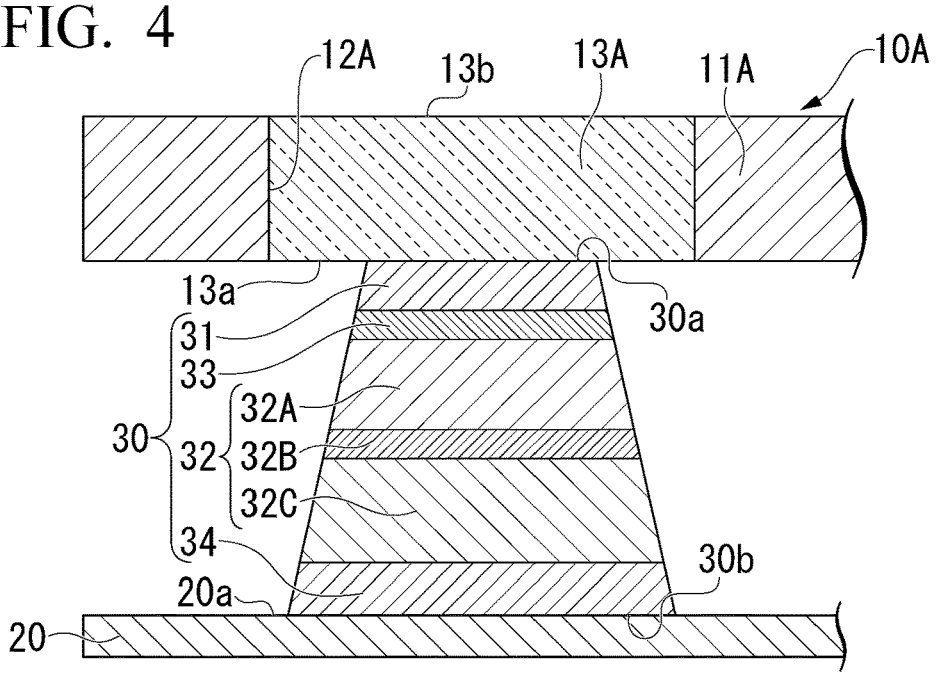
FIG. 4 is a cross-sectional view showing the configuration of the magnetic element provided in the photodetection element of HG. 1.

FIG. 4 is a cross-sectional view showing the configuration of the magnetic element 30 provided in the photodetection element 1 of FIG.

As shown in FIG. 4, the magnetic element 30 has at least the first ferromagnetic layer 31, the second ferromagnetic layer 32, and the spacer layer 33. The spacer layer 33 is located between the first ferromagnetic layer 31 and the second ferromagnetic layer 32, and is sandwiched between the first ferromagnetic layer 31 and the second ferromagnetic layer 32. Further, the magnetic element 30 has the underlayer 34 located between the second ferromagnetic layer 32 and the second electrode 20. In the present specification, ferromagnetism includes ferrimagnetism.

In addition to the above-mentioned layers, the magnetic element 30 may have other ferromagnetic layers, magnetic coupling layers, perpendicular magnetization-inducing layers, cap layers, side wall insulating layers, and the like.

The magnetic element 30 is, for example, an MTJ (Magnetic Tunnel Junction) element in which the spacer layer 33 is made of an insulating material. In this case, the magnetic element 30 applies a resistance value in the z direction (current in the z direction) according to a relative change between the magnetization state of the first ferromagnetic layer 31 and the magnetization state of the second ferromagnetic layer 32. Such an element is also called a magnetoresistive element. For example, in the magnetic element 30, the resistance value in the z direction (the resistance value when current is passed in the z direction) changes depending on the change in the relative angle between the direction of magnetization of the first ferromagnetic layer 31 and the direction of magnetization of the second ferromagnetic layer 32. In addition, in the magnetic element 30, the resistance value in the z direction (the resistance value when current is passed in the z direction) changes depending on the magnitude of magnetization of the first ferromagnetic layer 31. The total thickness of the magnetic element 30 is, for example, 15 nm to 40 nm.

The first ferromagnetic layer 31 is a photodetection layer whose magnetization state (for example, the magnetization direction or the magnitude of magnetization) changes when light from the outside is applied to the first ferromagnetic layer 31. The first ferromagnetic layer 31 is also called a magnetization free layer. The magnetization free layer is a layer including a magnet whose magnetization state (for example, the magnetization direction or the magnitude of magnetization) changes when prescribed external force is applied. The prescribed external force is, for example, light applied from the outside, current flowing through the magnetic element 30 in the z direction, or an external magnetic field.

The first ferromagnetic layer 31 contains a ferromagnet. The first ferromagnetic layer 31 contains, for example, magnetic elements such as Co, Fe, and Ni. The first ferromagnetic layer 31 may contain non-magnetic elements such as B, Mg, Hf, and Gd together with magnetic elements. Further, the first ferromagnetic layer 31 may be, for example, an alloy containing a magnetic element and a non-magnetic element. The first ferromagnetic layer 31 may be constituted from multiple layers. In this case, the first ferromagnetic layer 31 is, for example, a CoFeB alloy, a laminate in which a CoFeB alloy layer is sandwiched between Fe layers, and a laminate in which a CoFeB alloy layer is sandwiched between CoFe layers.

The first ferromagnetic layer 31 may be an in-plane magnetizing film having an easy-to-magnetize axis in the in-plane direction (any direction in the xy-plane). Alternatively, the first ferromagnetic layer 31 may be a perpendicularly magnetized film having an easy magnetization axis in the direct direction (z direction) of the film surface.

The film thickness of the first ferromagnetic layer 31 is, for example, 1 nm or more and 5 nm or less. It may be 1 nm or more and 2 nm or less. When the first ferromagnetic layer 31 is a perpendicularly magnetized film, if the thickness of the first ferromagnetic layer 31 is thin, the perpendicular magnetic anisotropy of the first ferromagnetic layer 31 increases. When the film thickness of the first ferromagnetic layer 31 is thicker than 2 nm, an insertion layer made of, for example, Mo and W may be provided in the first ferromagnetic layer 31.

That is, the first ferromagnetic layer 31 may be a laminate in which the ferromagnetic layer, the insertion layer, and the ferromagnetic layer are laminated in this order in the z direction. The interfacial magnetic anisotropy at the interface between the insertion layer and the ferromagnetic layer enhances the perpendicular magnetic anisotropy of the entire first ferromagnetic layer 31.

The second ferromagnetic layer 32 is a magnetization fixed layer. The magnetization fixed layer is a layer made of a magnet whose magnetization state (for example, the magnetization direction or the magnitude of magnetization) is less likely to change than that of the magnetization free layer when prescribed external force has been applied. For example, coercivity of the second ferromagnetic layer 32 is greater than that of the first ferromagnetic layer 31. The second ferromagnetic layer 32 has an axis of easy magnetization in the same direction as the first ferromagnetic layer 31. The second ferromagnetic layer 32 may be either an in-plane magnetization film or a perpendicular magnetization film.

In the present embodiment, the second ferromagnetic layer 32 is constituted of the inner ferromagnetic layer 32A, the non-magnetic layer 32B, and the outer ferromagnetic layer 32C. In this case, the magnetization of the inner ferromagnetic layer 32A is fixed by magnetic coupling with the outer ferromagnetic layer 32C via the non-magnetic layer 32B.

The material constituting the inner ferromagnetic layer 32A is, for example, the same as that of the first ferromagnetic layer 31. The inner ferromagnetic layer 32A may be, for example, a laminated in which Co having a thickness of 0.4 nm or more and 1.0 nm or less; Mo having a thickness of 0.1 nm or more and 0.5 nm or less; a CoFeB alloy having a thickness of 0.3 nm or less and 1.0 nm or less; and Fe having a thickness of 0.3 nm or more and 1.0 nm or less, are laminated in the order.

The outer ferromagnetic layer 32C is magnetically coupled to, for example, the inner ferromagnetic layer 32A. The magnetic coupling is, for example, an antiferromagnetic coupling and is caused by the RKKY interaction. The material constituting the outer ferromagnetic layer 32C is, for example, the same as that of the first ferromagnetic layer 31. The outer ferromagnetic layer 32C is, for example, a laminated film in which Co and Pt are alternately laminated, or a laminated film in which Co and Ni are alternately laminated.

The non-magnetic layer 32B is, for example, Ru, Ir, or the like. The film thickness of the non-magnetic layer 32B is, for example, a film thickness in which the inner ferromagnetic layer 32A and the outer ferromagnetic layer 32C are antiferromagnetically coupled by the RKKY interaction.

The spacer layer 33 is a non-magnetic layer disposed between the first ferromagnetic layer 31 and the second ferromagnetic layer 32. The spacer layer 33 is constituted of a layer composed of a conductor, an insulator or a semiconductor, or a layer including a current carrying point made of a conductor in the insulator. The film thickness of the spacer layer 33 can be adjusted according to the orientation direction of the magnetization of the first ferromagnetic layer 31 and the magnetization of the second ferromagnetic layer 32 in the initial state.

In this embodiment, the spacer layer 33 is made of an insulator. In this case, the magnetic element 30 has a magnetic tunnel junction (MTJ: Magnetic Tunnel Junction) constituted of the first ferromagnetic layer 31, the spacer layer 33, and the second ferromagnetic layer 32. Such an element is called an MTJ element. However, the spacer layer 33 may be made of metal. In that case, the magnetic element 30 can exhibit a giant magnetoresistive (GMR) effect. Such an element is called a GMR element.

When the spacer layer 33 is made of an insulating material, materials of aluminum oxide, magnesium oxide, titanium oxide, silicon oxide, and the like can be used. A high magnetoresistance change rate can be obtained by adjusting the thickness of the spacer layer 33 so that a strong TMR effect is exhibited between the first ferromagnetic layer 31 and the second ferromagnetic layer 32. In order to use the TMR (Tunnel Magnetoresistance) effect efficiently, the thickness of the spacer layer 33 may be about 0.5 nm or more and 10.0 nm or less.

When the spacer layer 33 is made of a nonmagnetic conductive material, a conductive material such as Cu, Ag, Au, or Ru can be used. In order to use the GMR effect efficiently, the thickness of the spacer layer 33 may be about 0.5 nm or more and 3.0 nm or less.

When the spacer layer 33 is made of a nonmagnetic semiconductor material, a material such as zinc oxide, indium oxide, tin oxide, germanium oxide, gallium oxide, or indium tin oxide (ITO) can be used. In this case, the thickness of the spacer layer 33 may be about 1.0 nm or more and 4.0 nm or less.

When a layer including a current carrying point made of a conductor within a nonmagnetic insulator is applied as the spacer layer 33, a structure may be formed to include a current carrying point made of a conductor of CoFe, CoFeB, CoFeSi, CoMnGe, CoMnSi, CoMnAl, Fe, Co, Au, Cu, Al, Mg, or the like within the nonmagnetic insulator made of aluminum oxide or magnesium oxide. In this case, a thickness of the spacer layer 33 may be about 0.5 nm or more and 2.0 nm or less. The current carrying point is, for example, a columnar body having a diameter of 1 nm or more and 5 nm or less.

As described above, the magnetic element 30 may be referred to as an MTJ element, a GMR element, or the like depending on the constituent material of the spacer layer 33, but is also collectively referred to as a magnetoresistive effect element.

The photodetection element 1 configured as described above is manufactured by a laminating step, a heat treatment step, and a processing step of each layer. First, the underlayer 34, the outer ferromagnetic layer 32C, the non-magnetic layer 32B, the inner ferromagnetic layer 32A, the spacer layer 33, and the first ferromagnetic layer 31 are laminated on the second electrode 20 in this order. Each layer is formed by, for example, sputtering. Further, another layer may be laminated if necessary, such as forming a cap layer on the first ferromagnetic layer 31.

Subsequently, the laminated film obtained as described above is subjected to a heat treatment such as annealing. When the annealing treatment is performed, the heating temperature is, for example, 400° C. or higher. Subsequently, the laminated film is processed into a prescribed columnar body by photolithography and etching. The columnar body may be a cylindrical body or a prismatic body. For example, the shortest width when the columnar body is viewed from the z direction may be 10 nm or more and 1000 nm or less.

Next, the first electrode 10A is produced on the first ferromagnetic layer 31 or on the cap layer (not shown). After that, the opening 12A is formed in a part of the first electrode 10A by a known method such as one using a resist and etching, and a transparent conductive film 13A is formed in the opening 12A by a known method such as sputtering. By performing the above-described steps, the photodetection element 1 is obtained.

When the transparent conductive film 13A is irradiated with light and the first ferromagnetic layer 31 of the magnetic element 30 is irradiated with light, the state of magnetization of the first ferromagnetic layer 31 (for example, the direction of magnetization or the magnitude of magnetization) changes, and the resistance value of the magnetic element 30 changes. The light detection element 1 outputs the light S1 applied to the magnetic element 30 through the transparent conductive film 13A as a change in voltage between the first electrode 10A and the second electrode 20.

Figure 5A:
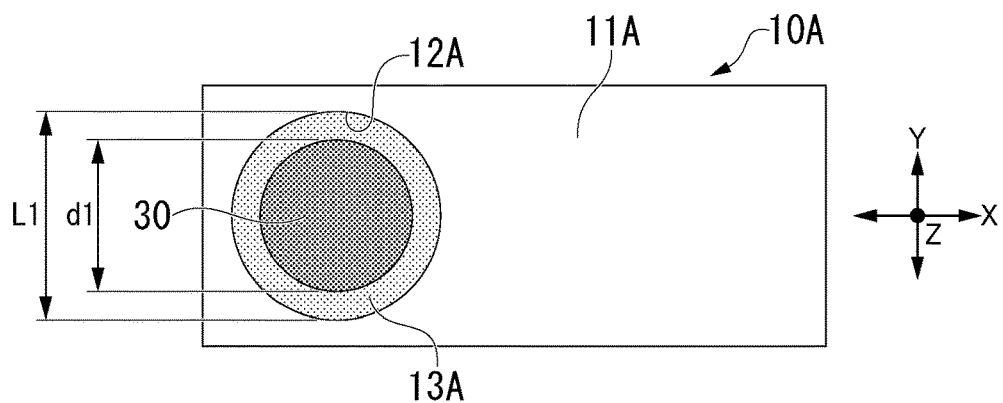
FIG. 5A is a plan view showing the configuration of the first electrode in FIG. 1.
Figure 5B:
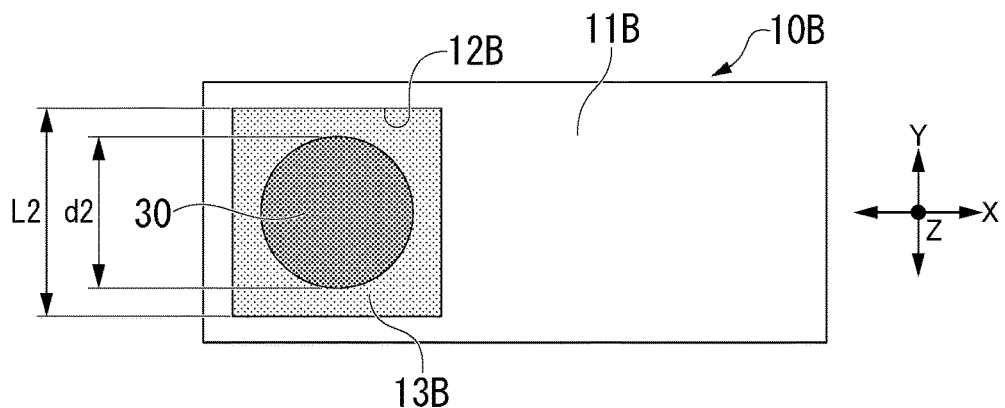
FIG. 5B is a plan view showing a modified example of the first electrode of FIG. 5A.

FIG. 5A is a plan view showing the configuration of the first electrode 10A in FIG. 1, and FIG. 5B is a plan view showing a modified example of the first electrode 10A of FIG. 5A.

As shown in FIG. 5A, the opening 12A may be provided so as to include the magnetic element 30 in a plan view from the z direction. In the present embodiment, in a plan view from the z direction, the opening 12A has a circular shape having a y-direction dimension of L1, and the transparent conductive film 13A also has a circular shape having a y-direction dimension of L1. Further, the magnetic element 30 may have a circular shape having a y-direction dimension d1 smaller than the y-direction dimension L1 of the opening 12A. The magnetic element 30 may have a square shape having a y-direction dimension d1 smaller than the y-direction dimension L1 of the opening 12A. As a result, the light S1 can be transmitted to the entire magnetic element 30, and the optical signal can be transmitted to the magnetic element 30 more efficiently.

Further, as shown in FIG. 5B, the opening 12B may be provided in the metal film 11B so as to include the magnetic element 30 in a plan view from the z direction. Then, in a plan view from the z direction, the opening 12B may have a square shape having a length in the y direction of L2, and the transparent conductive film 13B may have a square shape having a length in the y direction of L2. In this case, the magnetic element 30 has a circular shape having a y-direction dimension d2 smaller than the y-direction dimension L2 of the opening 12B. The magnetic element 30 may have a square shape having a y-direction dimension d2 smaller than the y-direction dimension L2 of the opening 12B.

Here, the opening in the present disclosure can take various shapes such as a distorted circular shape, a rectangular shape, and a polygonal shape. The "length of the opening" in the present disclosure refers to the length of the shortest line segment among the line segments that pass through the center of gravity of the opening and overlap the opening in a plan view.

Figure 6A:
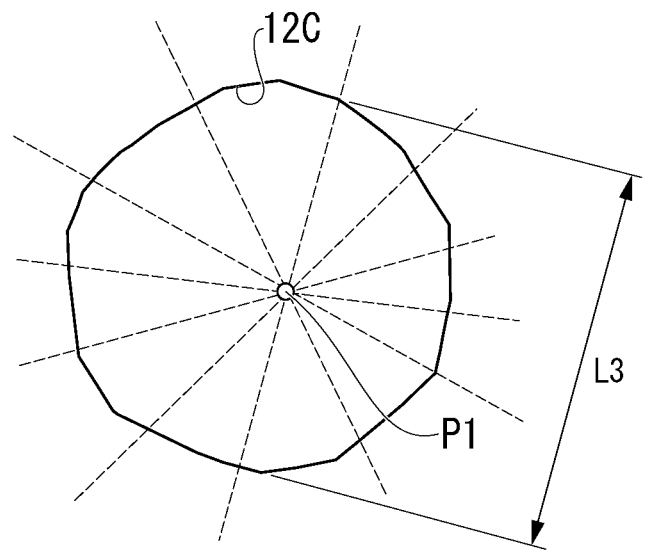
FIG. 6A is a diagram illustrating an example of the length of the opening in the present disclosure.

For example, as shown in FIG. 6A, the opening 12C has a distorted substantially circular shape. In this case, the length L3 of the opening 12C is the length of the shortest line segment that passes through the center of gravity P1 of the opening 12C and overlaps with the opening 12C in a plan view. The magnetic element 30 may have a circular shape or a square shape having a y-direction dimension d1 smaller than the length L3 of the opening 12C.

Figure 6B:
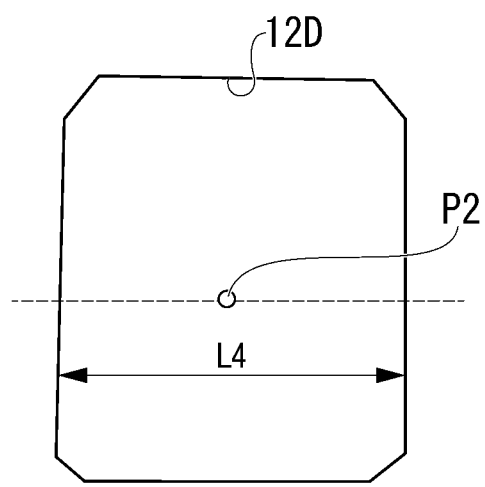
FIG. 6B is a diagram illustrating another example of the length of the opening in the present disclosure.

Further, as shown in FIG. 6B, the opening 12D has an octagonal shape. In this case, the length L4 of the opening 12D is the length of the shortest line segment that passes through the center of gravity P2 of the opening 12D and overlaps with the opening 12D. The magnetic element 30 may have a circular shape or a square shape having a y-direction dimension d2 smaller than the length L4 of the opening 12D.

Further, the length of the opening in the present disclosure may be smaller than the wavelength of the light applied to the transparent conductive film.

For example, the length L3 of the opening 12C may be smaller than the wavelength $\lambda$, of light ($d1<L3<\lambda$). Similarly, the length L4 of the opening 12D may be smaller than the wavelength $\lambda$, of light ($d2<L4<\lambda$). In the case where the length of the opening is smaller than the wavelength $\lambda$ of the light, when light is incident on the opening, near-field light is radially generated from the surface of the metal film of the opening, and this near-field light is transmitted to a relatively narrow range in the vicinity of the opening. Therefore, by making the length L3 of the opening 12C or the length L4 of the opening 12D smaller than the wavelength $\lambda$, of the light, the near-field light is generated by the light applied to the transparent conductive film 13A, which is provided to the opening 12C or the opening 12D; and the generated near-field light is applied to the magnetic element 30. By using near-field light in this way, the light intensity can be increased, and the optical signal can be transmitted to the magnetic element 30 more efficiently.

Figure 7:
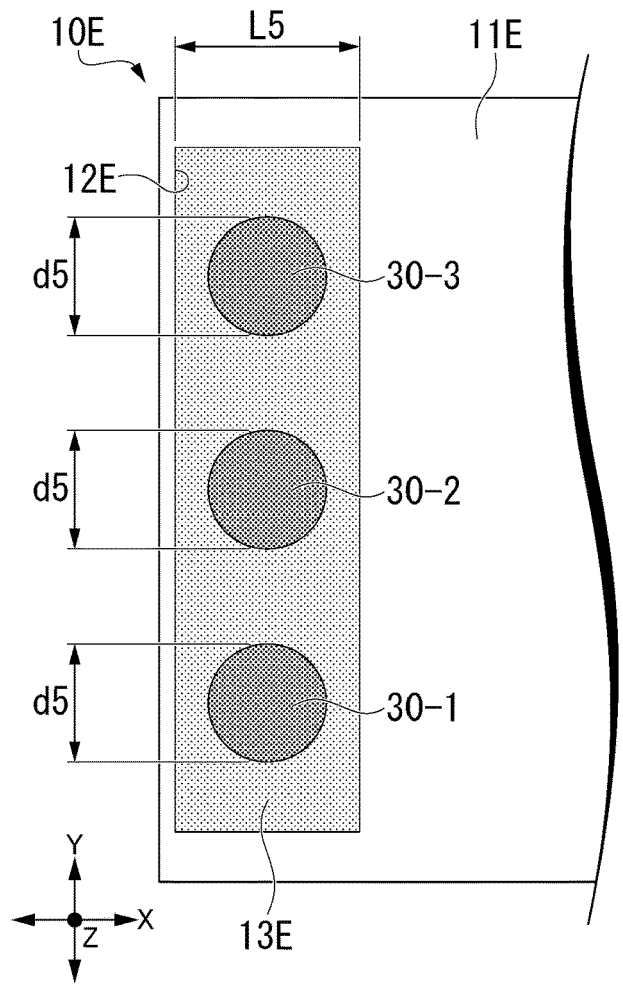
FIG. 7 is a plan view showing a modified example of the first electrode of FIG. 5B.

FIG. 7 is a plan view showing a modified example of the first electrode 10B of FIG. 5B.

As shown in FIG. 7, the first electrode 10E includes a metal film 11E, an opening 12E provided in a part of the metal film 11E, and a transparent conductive film 13E disposed in the opening 12E. The opening 12E extends in the y direction (the width direction of the first electrode 10E) and has a substantially rectangular shape in a plan view from the z direction. The opening 12E may have another shape such as an elliptical shape or an oval shape extending in the y direction.

In this modification, multiple magnetic elements 30-1, 30-2, and 30-3 are arranged in the y direction. The opening 12E is provided so as to include a plurality of magnetic elements 30-1, 30-2, and 30-3 in a plan view from the z direction. Each of the magnetic elements 30-1, 30-2, and 30-3 may have a circular shape or a square shape having a y-direction dimension d5 smaller than the x-direction dimension L5 of the opening 12E. As a result, the light S1 can be transmitted to the entire magnetic element 30, and the optical signal can be transmitted to the magnetic element 30 more efficiently.

Further, the length L5 of the opening 12E may be smaller than the wavelength 7 of the light applied to the transparent conductive film 13E (d5<L5<λ). As a result, the light intensity can be increased by the near-field light, and the optical signal can be transmitted to the magnetic element 30 more efficiently.

Figure 8:
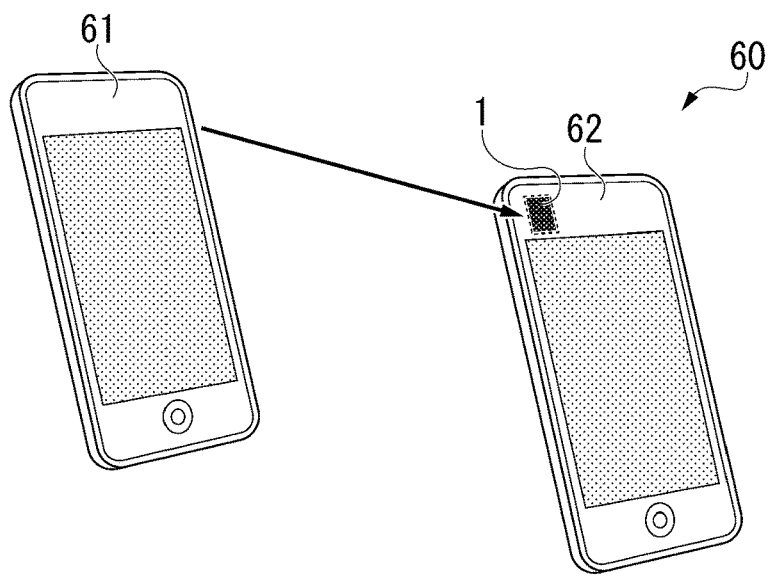
FIG. 8 is a diagram showing an example of a communication system using the optical detection element of FIG. 1.

FIG. 8 is a diagram showing an example of a communication system using the photodetection element 1 of FIG.

As shown in FIG. 8, the communication system 60 includes the first terminal device 61 and the second terminal device 62. The first terminal device 61 and the second terminal device 62 are not particularly limited, but are, for example, mobile terminal devices. Examples of mobile terminal devices include smartphones and tablets.

Each of the first terminal device 61 and the second terminal device 62 has a receiving device and a transmitting device (not shown). The optical signal transmitted from the transmitting device of the first terminal device 61 is received by the receiving device of the second terminal device 62. The light used for transmission/reception between the first terminal device 61 and the second terminal device 62 is, for example, visible light. Each receiving device is provided with a photodetection element, and the above-described photodetection element 1 can be used as the photodetection element of the receiving device of the communication system 60.

In the communication system of FIG. 8, the first terminal device 61 and the second terminal device 62 are mobile terminal devices, but the present invention is not limited to this descriptions. One or both of the two terminal devices may be a stationary terminal device. Further, one or both of the two terminal devices may function as nodes for IoT communication and the like. Further, the communication system of FIG. 8 is wireless one-to-one communication, but the present invention is not limited to this descriptions and may be wireless one-to-many communication.

As described above, according to the present embodiment, the transparent conductive film 13A (13B, 13E) is electrically connected to the magnetic element 30; and the transparent conductive film 13A (13B, 13E) is arranged in the opening 12A (12B, 12E) so as to overlap the magnetic element 30 in a plan view from the z direction. By satisfying these configurations, an optical signal can be efficiently transmitted to the magnetic element 30 to take out an electric signal, and the resistance of the first electrode 10A (10B, 10E) can be reduced. As a result, the electric signal from the magnetic element 30 can be efficiently taken out.

The present disclosure is not limited to the above-described embodiments and modified examples and various modifications and changes can be made within the scope of the subject matter of the present disclosure described within the scope of the claims.

What is claimed is:

1. An electrode structure comprising:
a metal film with an opening formed in a part of the metal film; and
a transparent conductive film disposed in the opening, wherein
the transparent conductive film is electronically connected to at least one magnetic element and overlaps with the at least one magnetic element as viewed in a plan view in a thickness direction of the transparent conductive film.

2. The electrode structure according to claim 1, wherein the opening is formed so that the at least one magnetic element is positioned within the opening as viewed in the plan view in the thickness direction.

3. The electrode structure according to claim 1, wherein a length of the opening is less than a wavelength of a light to be applied to the transparent conductive film.

4. The electrode structure according to claim 2, wherein a length of the opening is less than a wavelength of a light to be applied to the transparent conductive film.

5. A photodetection element comprising;
a first electrode having the electrode structure and a second electrode; and
as the element, at least one magnetic element disposed between the first electrode and the second electrode, the at least one magnetic element including a first ferromagnetic layer, a second ferromagnetic layer and a spacer layer sandwiched between the first ferromagnetic layer and the second ferromagnetic layer, wherein
the electrode structure comprises:
a metal film with an opening formed in a part of the metal film; and
a transparent conductive film disposed in the opening, wherein
the transparent conductive film is electronically connected to the at least one magnetic element and overlaps with the at least one magnetic element as viewed in a plan view in a thickness direction of the transparent conductive film, and the transparent conductive film is configured to be irradiated with light.

6. The photodetection element according to claim 5, wherein the opening is formed so that the magnetic element is positioned within the opening as viewed in the plan view in the thickness direction.

7. The photodetection element according to claim 5, wherein a length of the opening is less than a wavelength of a light to be applied to the transparent conductive film.

8. The photodetection element according to claim 6, wherein a length of the opening is less than a wavelength of a light to be applied to the transparent conductive film.

9. The photodetection element according to claim 5, further comprising a light transmitter, wherein
the light transmitter comprises,
a first diffraction grating portion disposed on one end of the light transmitter and configured to be irradiated with light from an outside,
a second diffraction grating portion disposed on other end of the light transmitter and configured to output light transmitted from the first diffraction grating portion; and
a waveguide disposed between the first diffraction grating portion and the second diffraction grating portion, and
an area of the first diffraction grating portion is more than an area of the second diffraction grating portion as views in a plan view of the light transmitter.

10. The photodetection element according to claim 6, further comprising a light transmitter, wherein
the light transmitter comprises,
a first diffraction grating portion disposed on one end of the light transmitter and configured to be irradiated with light from an outside,
a second diffraction grating portion disposed on other end of the light transmitter and configured to output light transmitted from the first diffraction grating portion; and a waveguide disposed between the first diffraction grating portion and the second diffraction grating portion, and an area of the first diffraction grating portion is more than an area of the second diffraction grating portion as views in a plan view of the light transmitter.

11. The photodetection element according to claim 7, further comprising a light transmitter, wherein the light transmitter comprises, a first diffraction grating portion disposed on one end of the light transmitter and configured to be irradiated with light from an outside, a second diffraction grating portion disposed on other end of the light transmitter and configured to output light transmitted from the first diffraction grating portion; and a waveguide disposed between the first diffraction grating portion and the second diffraction grating portion, and an area of the first diffraction grating portion is more than an area of the second diffraction grating portion as views in a plan view of the light transmitter.

12. The photodetection element according to claim 5, wherein the at least one magnetic element includes a plurality of magnetic elements arranged, and the opening is formed so that the plurality of magnetic elements are positioned within the opening as viewed in the plan view in the thickness direction of the transparent conductive film.

13. The photodetection element according to claim 6, wherein the at least one magnetic element includes a plurality of magnetic elements arranged, and the opening is formed so that the plurality of magnetic elements are positioned within the opening as viewed in the plan view in the thickness direction of the transparent conductive film.

14. The photodetection element according to claim 7, wherein the at least one magnetic element includes a plurality of magnetic elements arranged, and the opening is formed so that the plurality of magnetic elements are positioned within the opening as viewed in the plan view in the thickness direction of the transparent conductive film.

15. The photodetection element according to claim 8, wherein the at least one magnetic element includes a plurality of magnetic elements arranged, and the opening is formed so that the plurality of magnetic elements are positioned within the opening as viewed in the plan view in the thickness direction of the transparent conductive film.

16. The photodetection element according to claim 9, wherein the at least one magnetic element includes a plurality of magnetic elements arranged, and the opening is formed so that the plurality of magnetic elements are positioned within the opening as viewed in the plan view in the thickness direction of the transparent conductive film.

17. The photodetection element according to claim 10, wherein the at least one magnetic element includes a plurality of magnetic elements arranged, and the opening is formed so that the plurality of magnetic elements are positioned within the opening as viewed in the plan view in the thickness direction of the transparent conductive film.

18. The photodetection element according to claim 11, wherein the at least one magnetic element includes a plurality of magnetic elements arranged, and the opening is formed so that the plurality of magnetic elements are positioned within the opening as viewed in the plan view in the thickness direction of the transparent conductive film.

\* \* \* \* \*